United States Patent
Li et al.

(10) Patent No.: US 10,719,398 B1
(45) Date of Patent: Jul. 21, 2020

(54) RESILIENCE OF DATA STORAGE SYSTEMS BY MANAGING PARTIAL FAILURES OF SOLID STATE DRIVES

(71) Applicant: EMC IP HOLDING COMPANY LLC, Hopkinton, MA (US)

(72) Inventors: Jun Li, San Jose, CA (US); James Marriot Guyer, Northborough, MA (US); Michael D Garvey, Brimfield, MA (US); Stephen Richard Ives, West Boylston, MA (US)

(73) Assignee: EMC IP HOLDING COMPANY LLC, Hopkinton, MA (US)

( * ) Notice: Subject to any disclaimer, the term of this patent is extended or adjusted under 35 U.S.C. 154(b) by 187 days.

(21) Appl. No.: 15/653,341

(22) Filed: Jul. 18, 2017

(51) Int. Cl.
*G06F 11/00* (2006.01)
*G06F 11/10* (2006.01)
*G06F 3/06* (2006.01)
*G11C 29/52* (2006.01)

(52) U.S. Cl.
CPC .......... *G06F 11/108* (2013.01); *G06F 3/0619* (2013.01); *G11C 29/52* (2013.01); *G06F 3/0653* (2013.01)

(58) Field of Classification Search
CPC . G06F 11/108; G06F 11/1088; G06F 11/1092
See application file for complete search history.

(56) References Cited

U.S. PATENT DOCUMENTS

| | | | | |
|---|---|---|---|---|
| 6,412,089 B1* | 6/2002 | Lenny | ................ | G11B 20/1816 714/718 |
| 7,996,727 B2* | 8/2011 | Radke | ................ | G11C 11/56 714/42 |
| 8,131,926 B2* | 3/2012 | Lubbers | ................ | G06F 11/1076 711/114 |
| 8,195,978 B2* | 6/2012 | Flynn | ................ | G06F 11/1008 714/6.1 |
| 8,392,752 B2* | 3/2013 | Ikeuchi | ................ | G06F 11/1076 714/6.22 |
| 8,621,290 B2* | 12/2013 | Daga | ................ | G06F 11/1012 714/701 |
| 8,880,801 B1* | 11/2014 | Robins | ................ | G06F 12/0246 711/114 |
| 9,641,615 B1* | 5/2017 | Robins | ................ | H04L 67/1097 |
| 9,690,660 B1* | 6/2017 | Robins | ................ | G06F 16/24578 |
| 9,983,963 B2* | 5/2018 | Li | ................ | G06F 11/2094 |
| 2013/0054913 A1* | 2/2013 | Maeda | ................ | G06F 9/50 711/162 |

(Continued)

*Primary Examiner* — Elmire Mehrmanesh
(74) *Attorney, Agent, or Firm* — Anderson Gorecki LLP (57) ABSTRACT

Each SSD in an array is divided into splits that are contiguous LBA ranges of equal capacity. The splits are managed as if they were sub-drives or logical drives and used in RAID groups or other forms of redundancy schemes. A processor external to the SSD collects pending defect data log from the SSDs and determines which splits are associated with reported defects. Failed splits are rebuilt in spare splits using RAID or another redundancy scheme. Repaired splits are returned to service as spare splits. Irreparable splits are marked as lost. In the case of SSD failure the data splits of the SSD are rebuilt to a spare SSD. If enough failed splits of the failed SSD can be repaired then the repaired SSD may be returned to service.

20 Claims, 6 Drawing Sheets

(56) References Cited

U.S. PATENT DOCUMENTS

| | | | |
|---|---|---|---|
| 2013/0227345 A1* | 8/2013 | Gadekar | G06F 11/1092 714/6.22 |
| 2015/0199129 A1* | 7/2015 | Nair | G06F 3/064 711/114 |
| 2016/0239397 A1* | 8/2016 | Thomas | G06F 11/2094 |

* cited by examiner

RESILIENCE OF DATA STORAGE SYSTEMS BY MANAGING PARTIAL FAILURES OF SOLID STATE DRIVES

BACKGROUND

The subject matter of this disclosure is generally related to data storage systems that may be used to maintain data for multiple host servers and many concurrent users. Host servers may run host applications such as a database, file server or block server, for example and without limitation. The data storage system may include one or more storage arrays, each of which may include a plurality of interconnected computing nodes. The computing nodes manage access to host application data stored on data storage devices such as HDDs (Hard Disk Drives) and SSDs (Solid State Drives).

SUMMARY

All examples, aspects, features, and implementations mentioned in this document can be combined in any technically possible way.

Some aspects disclosed herein may be predicated in part on recognition that at least some SSDs are not ideally suited to being managed and used in the same manner that HDDs are managed and used in accordance with the current state of the art. HDDs include moving parts such as spinning disk magnetic storage media. Common causes of HDD failure include mechanical wear, motor failure and head crashes. SSDs, which may include multiple NAND or NOR flash semiconductor chips (hereafter "dies"), do not have moving parts. SSDs exhibit wear as a function of use so their endurance is a function of the number of the write operations performed. One common cause of SSD failure is die failure, e.g. due to accumulation of failed cells. It has been standard practice in the art to organize HDDs into a redundancy group in order to protect against data loss. For example and without limitation, various levels of RAID (Redundant Array of Independent Disks) are known in the art. A RAID-1, for example, maintains copies of a set of data on two or more mirrored HDDs. Consequently, if one of the mirrored HDDs fails the data is still available from the remaining mirrored HDD. This allows a spare HDD to be built to replace the failed mirror HDD. While such a system is highly reliable, it will be appreciated that it can require considerable storage capacity. Features such as parity information are used in some RAID levels in order to achieve redundancy with reduced storage capacity requirements. Features such as byte or block level striping are used in some RAID levels in order to achieve enhanced response time. RAID-5, for example, uses block level striping with parity data distributed across all HDDs. Groups of SSDs can also be organized into a RAID. However, a single SSD may have many dies and a relatively larger storage capacity in comparison with HDDs. Moreover, an SSD may be considered as failed even if only one or two of the dies fail. Consequently, managing SSDs in the same manner as HDDs can lead to increased overhead associated with rebuilding the larger capacity failed SSDs. Moreover, aspects are not limited to RAID and may be applicable to erasure coding and a wide variety of other redundancy techniques.

In accordance with an aspect an apparatus comprises a storage array comprising: at least one computing node comprising at least one processor and non-transitory memory; a drive array comprising a plurality of SSDs (solid state drives), the drive array in communication with the computing node; and at least one processor, external with respect to the SSDs, that implements instructions comprising: organizing instructions that organize the SSDs as a plurality of splits, each split comprising a contiguous range of logical addresses presented by one of the SSDs and having a capacity equal to other splits of the plurality of splits, and; grouping instructions that group a plurality of spare splits of the plurality of splits into a redundancy group; management instructions that manage the splits of the redundancy group as logical drives; monitoring instructions that detect a failed split of the redundancy group; and rebuilding instructions that rebuild the failed split on a spare split. In some implementations the organizing instructions organize the splits into logical slices of equal capacity corresponding to a track, a cylinder, a fraction of SSD capacity, or a percentage of SSD capacity. In some implementations the logical addresses are LBAs (logical block addresses). In some implementations non-contiguous physical addresses map to the contiguous range of logical addresses of each split. In some implementations the non-contiguous physical addresses of each split map to a plurality of dies. In some implementations the monitoring instructions process pending defect data logs from the SSDs to identify splits with which reported defects are associated. In some implementations the rebuilding instructions selects the spare split from an SSD having a greatest number of spare splits. In some implementations remediation instructions attempt to repair the failed split. In some implementations the remediation instructions return repaired splits to service as spare splits and mark unrepairable splits as lost splits. In some implementations the rebuilding instructions rebuild all failed data splits of a failed SSD on a spare SSD, and the remediation instructions return repaired SSDs to service and mark unrepairable SSDs as lost.

In accordance with an aspect a method comprises: in a storage array comprising at least one computing node comprising at least one processor and non-transitory memory, and a drive array comprising a plurality of SSDs (solid state drives), the drive array in communication with the computing node: externally with respect to the SSDs, organizing the SSDs as a plurality of splits, each split comprising a contiguous range of logical addresses presented by one of the SSDs and having a capacity equal to other splits of the plurality of splits; grouping a plurality of spare splits into a redundancy group; managing the splits of the redundancy group as logical drives; detecting a failed split of the redundancy group; and rebuilding the failed split on a spare split. Some implementations comprise organizing the splits into logical slices of equal capacity corresponding to a track, a cylinder, a fraction of SSD capacity, or a percentage of SSD capacity. In some implementations the logical addresses are LBAs (logical block addresses), and non-contiguous physical addresses map to the contiguous range of logical addresses of each split, and the non-contiguous physical addresses of each split map to a plurality of dies, and each split is organized as a contiguous range of LBAs. Some implementations comprise processing pending defect data logs from the SSDs to identify splits with which reported defects are associated. Some implementations comprise selecting the spare split from an SSD having a greatest number of spare splits. Some implementations comprise attempting to repair the failed split. Some implementations comprise returning repaired splits to service as spare splits. Some implementations comprise marking unrepairable splits as lost splits. Some implementations comprise rebuilding all failed data splits of a failed SSD on a spare SSD.

Some implementations comprise returning repaired SSDs to service and marking unrepairable SSDs as lost.

DETAILED DESCRIPTION

Some aspects, features and implementations described herein may include machines such as computers, electronic components, optical components, and processes such as computer-implemented procedures and steps. It will be apparent to those of ordinary skill in the art that the computer-implemented procedures and steps may be stored as computer-executable instructions on a non-transitory computer-readable medium. Furthermore, it will be understood by those of ordinary skill in the art that the computer-executable instructions may be executed on a variety of tangible processor devices, i.e. physical hardware. For ease of exposition, not every step, device or component that may be part of a computer or data storage system is described herein. Those of ordinary skill in the art will recognize such steps, devices and components in view of the teachings of the present disclosure and the knowledge generally available to those of ordinary skill in the art. The corresponding machines and processes are therefore enabled and within the scope of the disclosure.

The terminology used in this disclosure is intended to be interpreted broadly within the limits of subject matter eligibility. The terms "logical" and "virtual" are used to refer to features that are abstractions of other features, e.g. and without limitation abstractions of tangible features. The term "physical" is used to refer to tangible features, including but not limited to hardware. For example, multiple virtual computing devices could operate simultaneously on one physical computing device. The term "logic" is used to refer to special purpose physical circuit elements and software instructions that are stored on a non-transitory computer-readable medium and implemented by multi-purpose tangible processors.

Figure 1:
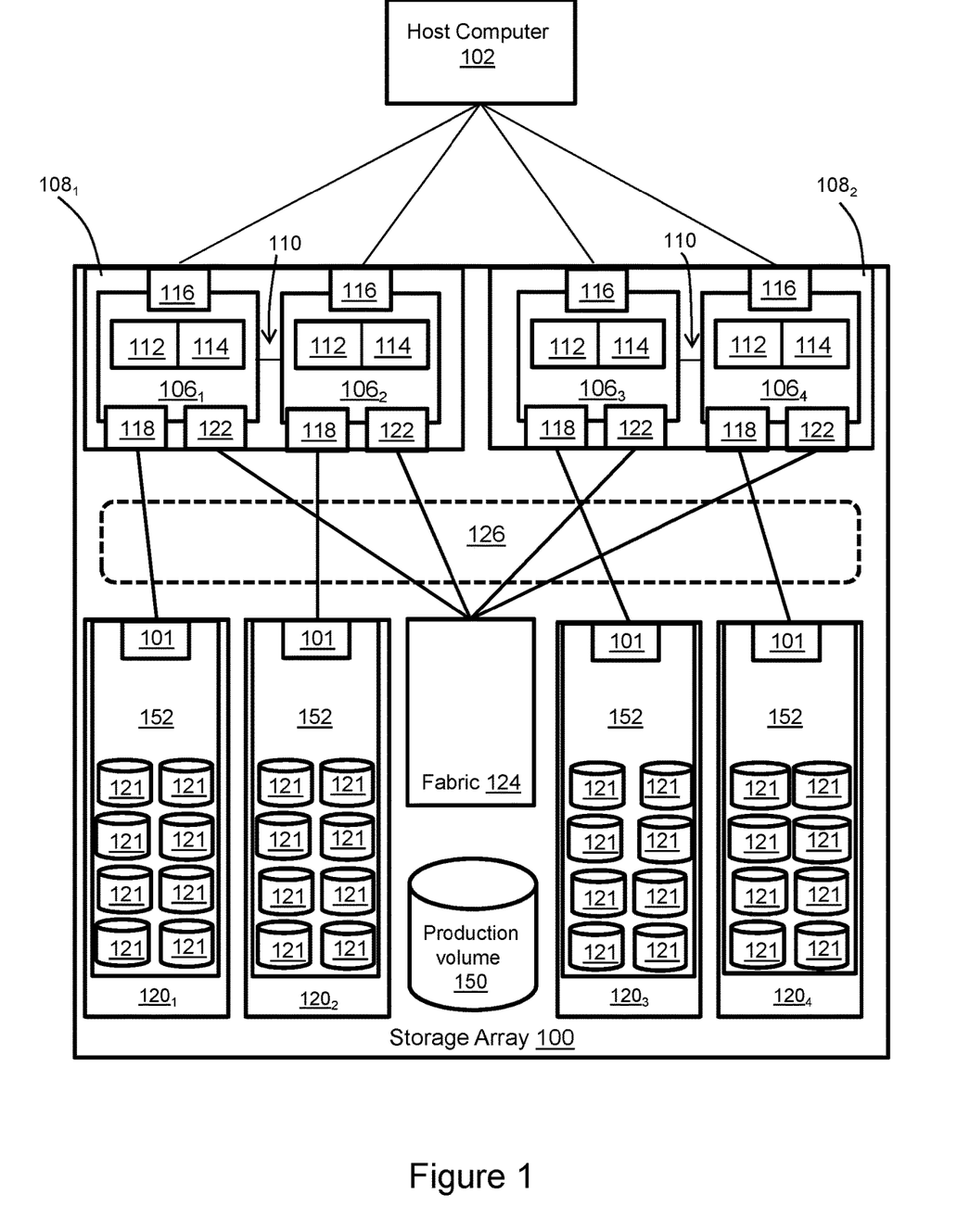
FIG. 1 illustrates a storage array that manages both partial and complete failure of SSDs.

FIG. 1 illustrates a storage array 100 that manages both partial and complete failure of SSDs. The illustrated storage array is only one example of a wide variety of storage arrays in which the features disclosed herein may be implemented. The storage array 100 includes a plurality of computing nodes $106_1$-$106_4$. Pairs of the computing nodes ($106_1$, $106_2$) and ($106_3$, $106_4$) may be organized as storage engines 1081, 1082, respectively, for purposes of failover. The paired computing nodes of each storage engine may be directly interconnected by communication links 110. Each computing node includes at least one physical multi-core processor 112 and a local cache 114. The local cache may include, for example and without limitation, volatile memory components such as RAM (Random Access Memory). Each computing node may also include one or more CAs (Channel Adapters) 122 for communicating with other computing nodes via an interconnecting fabric 124. Each computing node may allocate a portion or partition of its respective local cache 114 to a virtual shared cache 126 that can be accessed by other computing nodes, e.g. via DMA (Direct Memory Access) or RDMA (Remote Direct Memory Access). Each computing node may include one or more FEs 116 (Front-End adapters) for communicating with a host computer 102. Each computing node $106_1$-$106_4$ may also include one or more BEs 118 (Back End adapters) for communicating with drive arrays $120_1$-$120_4$.

The computing nodes $106_1$-$106_4$ create and maintain a logical production volume 150 for a host application running on the host computer 102. Without limitation, the production volume 150 may be referred to as a production device, production LUN or host LUN, where LUN (Logical Unit Number) is a number used to identify the logical storage volume in accordance with the SCSI (Small Computer System Interface) protocol. The production volume 150 represents an abstraction layer between managed drives 121 and the host computer 102, of which there may be many in a cluster. From the perspective of the host computer the production volume 150 is a single data storage device having a set of contiguous fixed-size LBAs (Logical Block Addresses) on which data used by a host application resides. However, the data used by the host application may actually be maintained by the computing nodes at non-contiguous addresses on various different managed drives 121. In response to an IO from the host computer 102 the receiving computing node temporarily places data for servicing IOs associated with the production volume 150 into the shared cache 126. For example, the computing node may communicate with the drive array controller in order to copy the data from the managed drives into the shared cache. The shared cache 126 may enable the production volume 150 to be reachable via all of the computing nodes and paths, although the storage array can be configured to limit use of certain paths to certain logical volumes. For example, the production volume 150 may be configured to be accessible via only a subset of FAs 116.

The managed drives 121 of the drive arrays $120_1$-$120_4$ are accessed via drive array controllers 152, of which there may be more than one. The managed drives 121 may include tangible storage devices of one or more technology types, for example and without limitation NAND flash based SSDs, and traditional HDDs using SAS (serial attached SCSI), SATA (Serial Advanced Technology Attachment) and FC (Fibre Channel) interfaces, but for purposes of explanation all of the managed drives will be described as SSDs. In other words, the storage array may be an "all flash" storage array. The storage array may use the NVMe (Non-Volatile Memory Express) logical device interface, or any other interface or protocol, to access the SSDs. In order to access the managed drives the BEs 118 communicate with a respective drive array controller 152 with which the BE is connected. Each drive array controller 152 is a hardware device that manages access to the managed drives 121 and presents the storage space of the managed drives to the connected computing node as one or more logical units of storage. From the perspective of the drive array controller 152 the storage resources of each managed drive are represented as a contiguous range of addresses, e.g. and without limitation LBAs. Each managed drive may include an internal controller that maps the contiguous LBAs to non-contiguous physical addresses of storage cells. As will be explained in greater detail below, the computing nodes, drive array controllers or other components with processing capabilities are used to manage both partial and complete failure of SSD managed drives.

Figure 2:
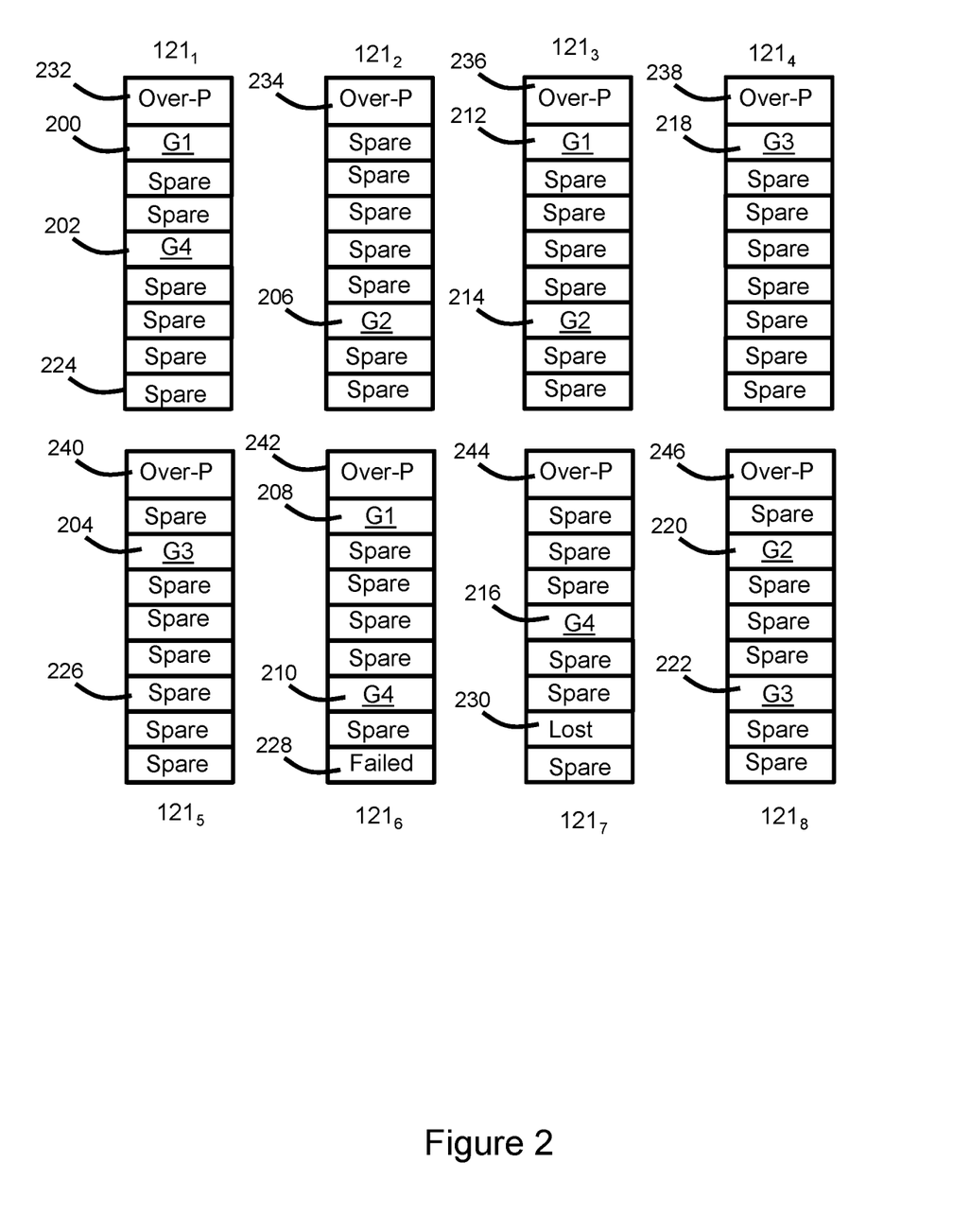
FIG. 2 illustrates use of "splits" to manage SSDs in the storage array of FIG. 1.

FIG. 2 illustrates use of "splits" to manage both partial and complete failure of SSDs. A group of SSDs $121_1$ through $121_8$, which may be the managed drives associated with a drive array controller and computing node of the storage array, represent a storage pool. The SSDs of the storage pool are each organized as a plurality of logical slices of equal capacity, hereafter referred to as "splits." Each split includes a contiguous range of logical addresses, e.g. and without limitation LBAs, as presented by the SSD. As mentioned above, the physical addresses to which the logical addresses map are not all contiguous. Controllers that are internal to the SSDs maintain respective mappings between the logical addresses and the physical addresses. Moreover, the mapping may be under the sole control of the internal controller of the SSD, and may remain hidden from external components such as the drive array controller.

The storage capacity of a single split is a design implementation but, for context and without limitation, may be equivalent to a track, cylinder or some fraction or percentage of the capacity of the managed drive, e.g. and without limitation ½, ⅓, ⅛, 1/16, 1/32, 1/64, 10%, 20% of total SSD capacity, and so forth. A sector may be the smallest unit of storage that a managed drive processes, e.g. providing a sector in response to a read or overwriting a sector in response to a write. 1 sector may be, for example and without limitation, 512 bytes. 1 block may be 8 sectors. 1 track may be 32 sectors. 1 cylinder may be 15 tracks. Smaller size splits may decrease the overhead associated with rebuilding splits but at a cost of increased metadata management overhead.

Splits 200 through 222 that contain data are referred to as "data splits." Operational splits that do not contain data, e.g. splits 224, 226, are referred to as "spare splits." Splits that have failed, e.g., split 228, are referred to as "failed splits." Splits that have been irreparably lost, e.g., split 230, are referred to as "lost splits." In addition to splits, each SSD maintains some storage capacity as overprovision 232 through 246, respectively. The use and capacity of overprovision is not necessarily reported outside of the SSD and may be used internally for a variety of functions. For example, the SSD internal controller may relocate data from failing storage cells to overprovision based on internal processes.

The splits are managed (externally with respect to the SSDs) as sub-drives or logical drives for implementation of redundancy groups and redundancy schemes including but not limited to RAID and erasure coding. In the illustrated example there are four RAID-5 3+1 groups G1, G2, G3, G4. The splits within a RAID group may initially be selected from the set of spare splits in the storage pool. For example and without limitation, spare splits may be selected on the basis of the number of available spare splits in each SSD, e.g. selecting each successive split from the SSD having the greatest number of spare splits. Due to the internal mapping between physical and logical addresses the data in each data split may be distributed across multiple dies of the SSD. In some implementations only one split of any given RAID group can reside on a given SSD, i.e., more than one split of the same RAID group cannot be located on the same SSD. In other implementations multiple splits of the same RAID group may be located on the same SSD. Although a RAID-5 implementation is illustrated and described, the implementation of other RAID levels will be understood by those of ordinary skill in the art in light of the present disclosure.

Figure 3:
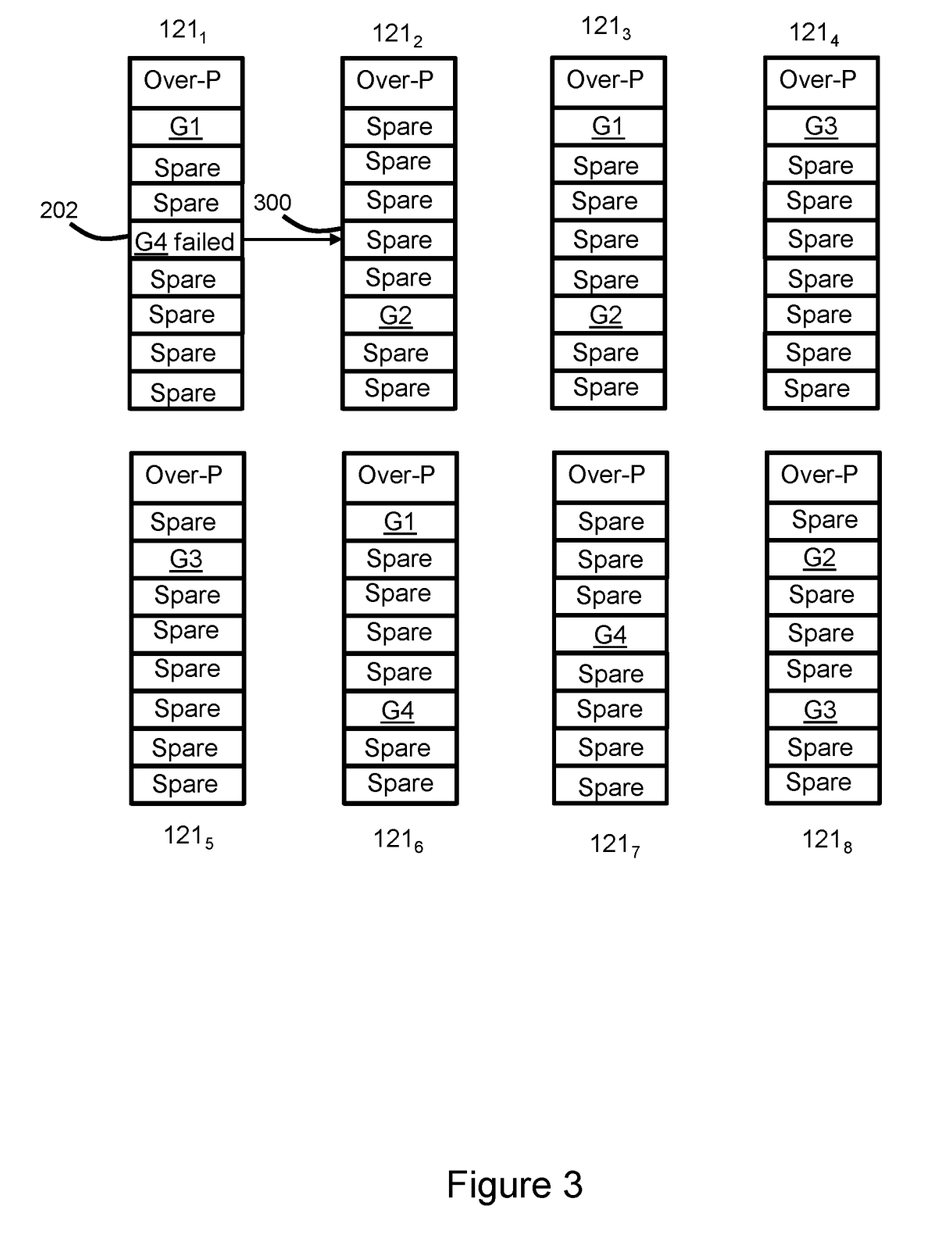
FIGS. 3 and 4 illustrate rebuilding a failed split.
Figure 4:
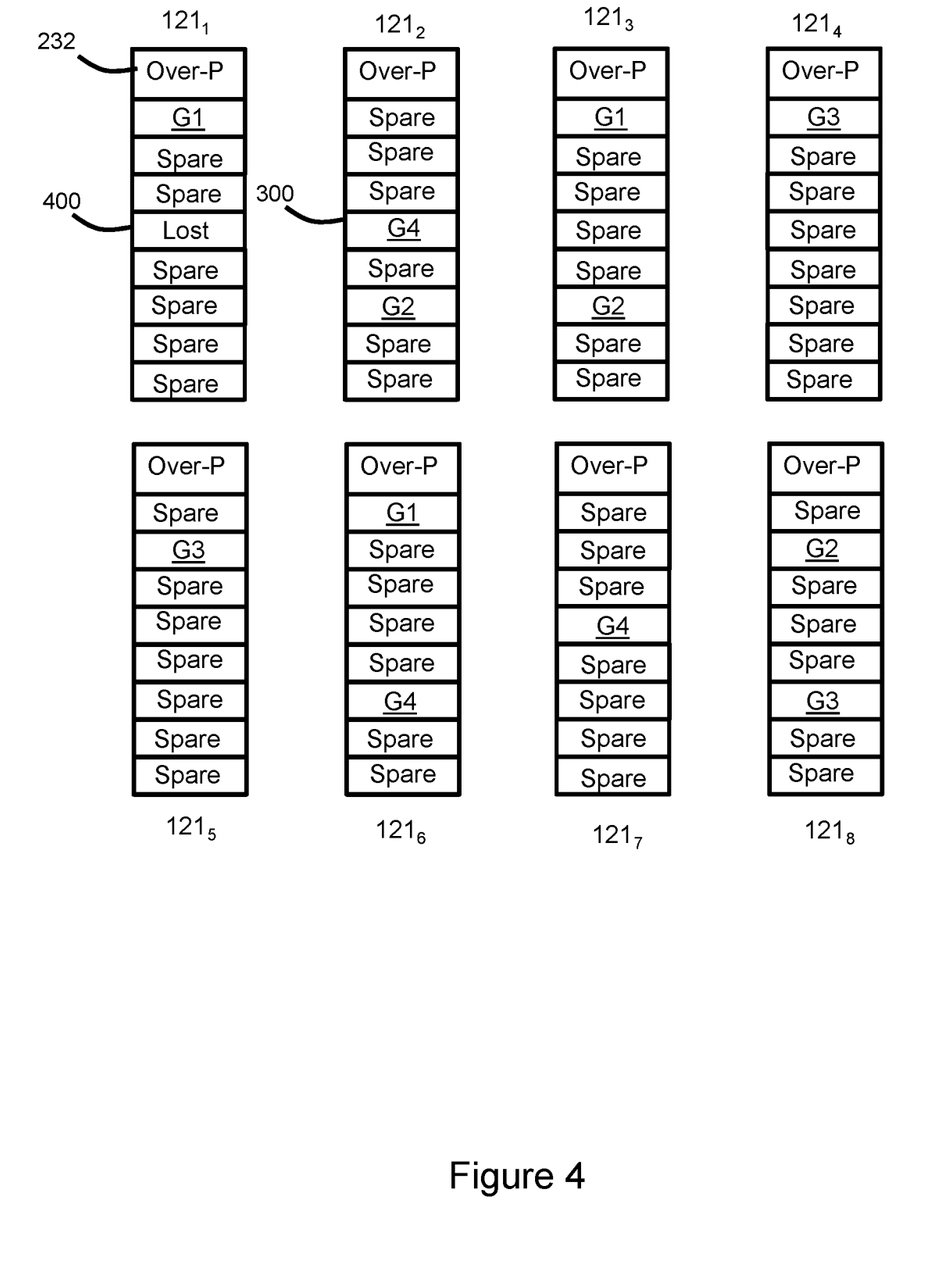

FIGS. 3 and 4 illustrate rebuilding of a failed split that is associated with a RAID group. In the depicted example data split 202 fails. Data split 202 is associated with RAID group G4 and located on SSD $121_1$. As will be explained in greater detail below, pending defect logs provided by SSD $121_1$ may be used to identify the status of LBAs and thus identify failed splits such as split 202. In response to the failure detected from processing the pending defect log, the drive array controller (or some other component outside of the SSD) causes the failed split to be rebuilt in a selected spare split 300. The spare split may be selected from the SSD having the greatest number of spare splits although a wide variety of other implementations are possible. Consequently, the spare split may be located on the same SSD as the failed split in some implementations. The failed split 202 would, in this RAID-5 example, be rebuilt using parity information. In other examples mirrors might be used in accordance with known RAID techniques.

The failed split 202 may initially be tagged as failed rather than lost until remediation is attempted. Varieties of repair techniques are understood in the art and thus will not be discussed in detail. If efforts to repair the failed split are unsuccessful then the split may be tagged as an irreparably lost split 400 as specifically illustrated in FIG. 4. If efforts to repair the failed split are successful then it may be returned to service as a spare split. The tracked capacity of the overprovision 232 may be adjusted accordingly (as tracked outside the SSD).

Although the disclosed aspects are not necessarily bound to any specific advantages, the rebuilding of individual splits generally requires less overhead than the rebuilding of entire SSDs because less data needs to be recreated, e.g. based on parity, and written. Further, the overprovision capacity and unutilized spare splits may be tracked and managed in order to maintain balanced (or strategically unbalanced) utilization of SSDs in the storage pool. The tracked information may also be used to help prolong the operational life of each SSD, e.g. by decreasing the spare capacity utilization, and locating data splits based on write endurance utilization and accumulation of failed and lost splits.

Figure 5:
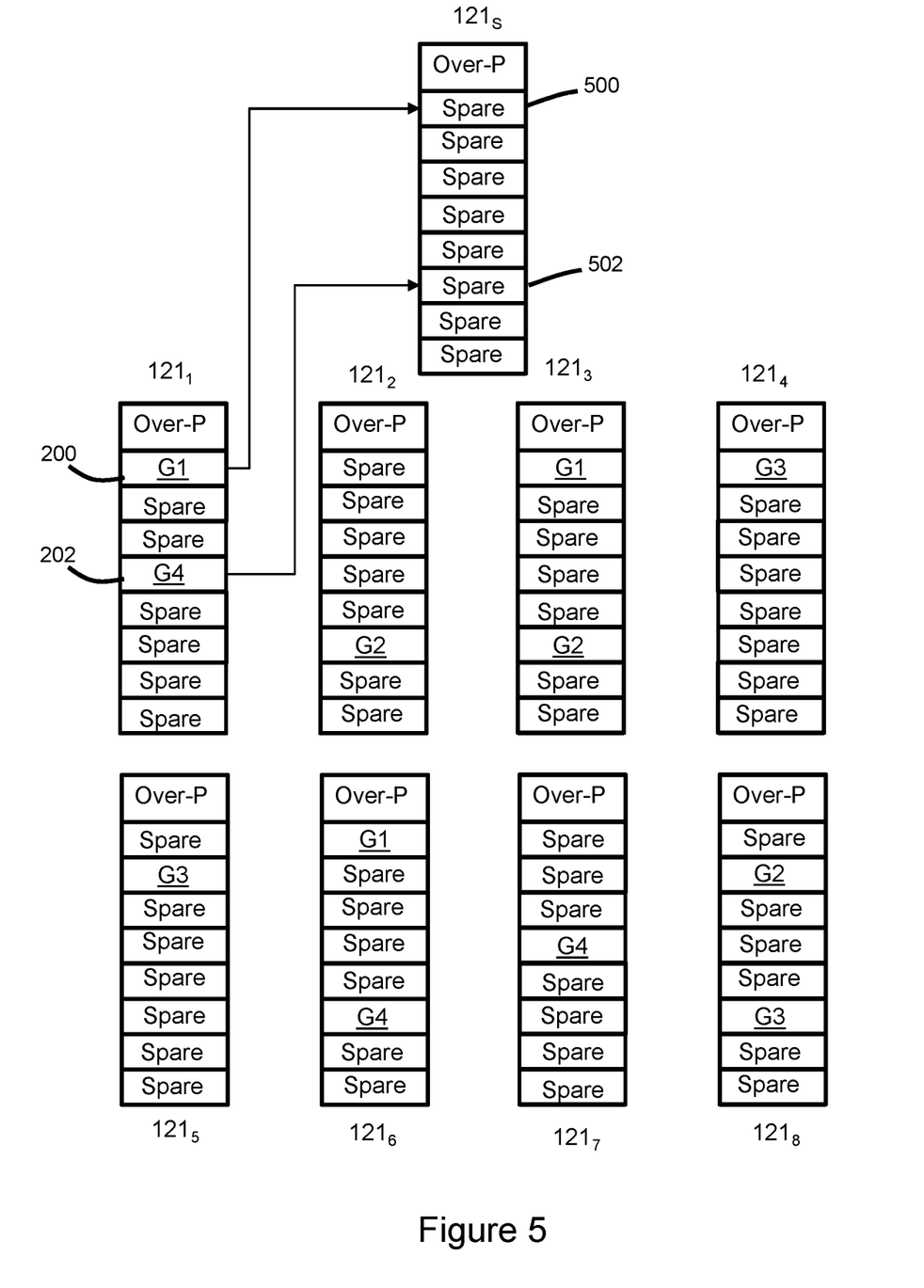
FIG. 5 illustrates rebuilding a failed SSD.

FIG. 5 illustrates the rebuilding of a failed SSD. In the illustrated example SSD $121_1$ fails. In this simplified example the failed SSD includes only two data splits 200, 202, both of which are associated with RAID groups. Specifically, the failed SSD includes a split 200 associated with RAID group G1 and split 202 associated with RAID group G4. All of the data splits associated with the failed SSD are rebuilt in spare splits on any set of SSDs or even outside of the drive array or storage array. In some implementations the failed SSD is rebuilt on a spare SSD. In the illustrated example data split 200 is rebuilt on spare split 500 of spare SSD $121_S$ and data split 202 is rebuilt on spare split 502 of spare SSD $121_S$. Remediation of the failed SSD $121_1$ may be attempted. If enough splits can be repaired then the failed SSD may be returned to service. More particularly, repaired splits are returned to service as spare splits and lost splits are tagged as irreparably lost. If repair efforts fail then the failed SSD is marked as lost and replaced.

Figure 6:
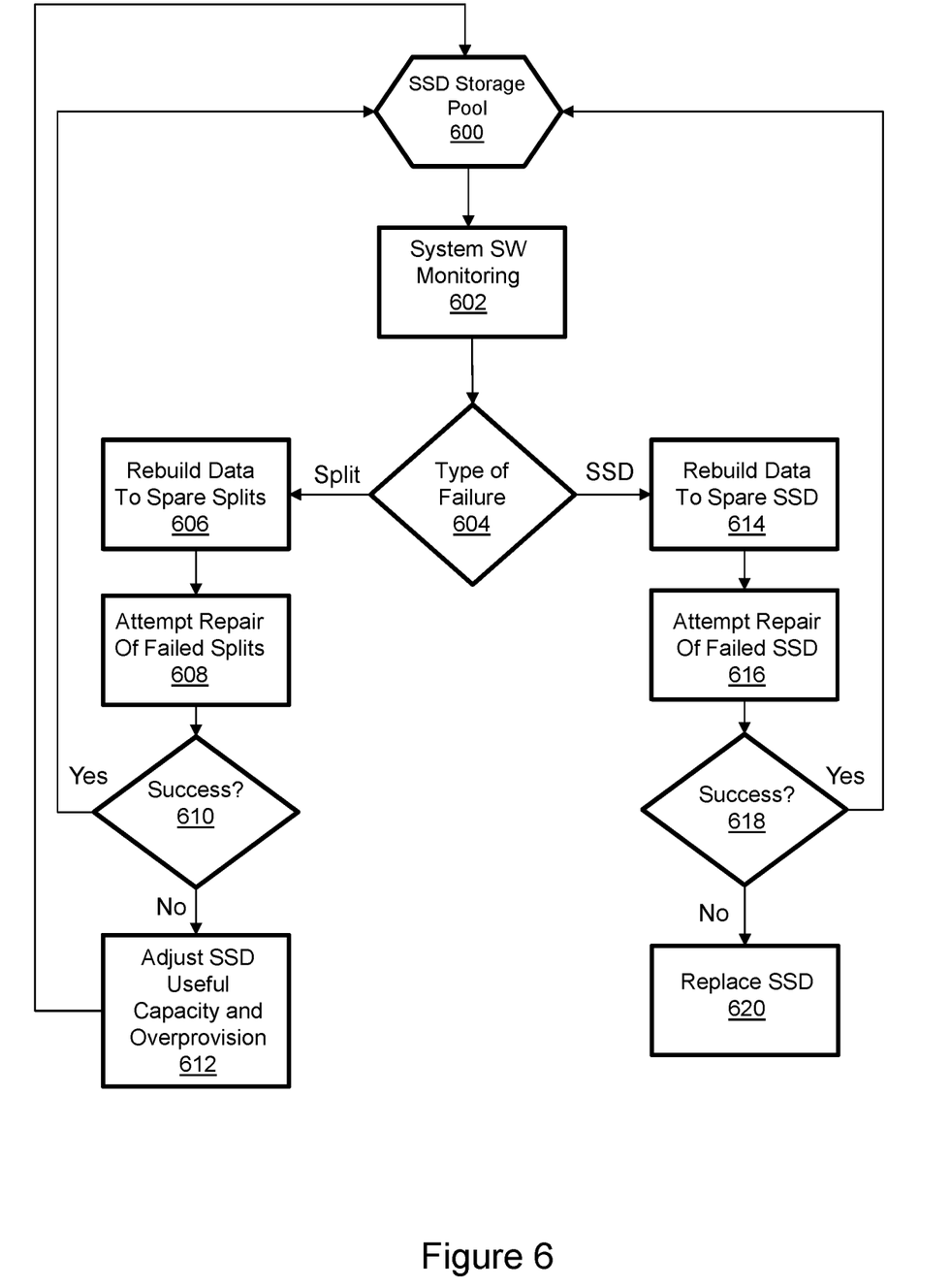
FIG. 6 is a flow diagram that illustrates management of both partial and complete failure of SSDs.

FIG. 6 is a flow diagram that illustrates management of both partial and complete failure of SSDs. The storage array includes an SSD storage pool 600 that is organized into splits. System software outside of the SSDs monitors the SSDs of the storage pool as indicated in block 602. The system software collects pending defect data logs from the SSDs and uses the information in those defect logs to identify the splits with which the reported defects are associated. In response to detection of a failure, the type of failure is determined as indicated in block 604. In the case of a data split failure the data is rebuilt to a spare split as indicated in block 606. The spare split may be selected in any of a wide variety of different ways, including but not limited to maintaining relative balance of the number of spare splits on each SSD of the storage pool. Repair of the failed split is attempted as indicated in block 608. If the repair of the failed split is successful as determined in block 610 then the repaired split is returned to the SSD storage pool 600. If repair of the failed split is unsuccessful as determined in block 610 then the failed split is marked as a lost split and the useful capacity and overprovision of the SSD are adjusted as indicated in block 612. Adjusting the useful capacity allows the system (outside the SSD) to track the number of spare splits on each SSD as splits become failed and lost. Adjusting the overprovision allows the system (outside the SSD) to track when an SSD may have diminished overprovision capacity.

If the type of failure is determined in block 604 to be an SSD failure then the data splits of the failed SSD are rebuilt to a spare SSD as indicated in block 614. Repair of the failed SSD is attempted as indicated in block 616. If the repair of the failed SSD is successful as determined in block 618 then the repaired SSD is returned to the SSD storage pool 600. The repaired SSD may have repaired splits marked as spare splits and unrepaired splits marked as lost splits. If repair of the failed SSD is unsuccessful as determined in block 618 then the failed SSD is marked as a lost and replaced as indicated in block 620.

A number of features, aspects, embodiments and implementations have been described. Nevertheless, it will be understood that a wide variety of modifications and combinations may be made without departing from the scope of the inventive concepts described herein. Accordingly, those modifications and combinations are within the scope of the following claims.

What is claimed is:

1. An apparatus comprising:
   a storage array comprising:
      at least one computing node comprising at least one processor and non-transitory memory;
      a drive array comprising a plurality of SSDs (solid state drives), the drive array in communication with the computing node; and
      at least one processor, external with respect to the SSDs, that implements instructions comprising:
         organizing instructions that organize the SSDs as a plurality of splits, each split comprising a contiguous range of logical addresses presented by one of the SSDs and having a capacity equal to other splits of the plurality of splits;
         grouping instructions that group a plurality of spare splits of the plurality of splits into a redundancy group;
         monitoring instructions that detect a failed split of the redundancy group on a non-failed one of the SSDs; and
         rebuilding instructions that rebuild the failed split on a spare split.

2. The apparatus of claim 1 wherein the organizing instructions organize the splits into logical slices of equal capacity corresponding to a track, a cylinder, a fraction of SSD capacity, or a percentage of SSD capacity.

3. The apparatus of claim 1 wherein the logical addresses are LBAs (logical block addresses).

4. The apparatus of claim 1 wherein non-contiguous physical addresses map to the contiguous range of logical addresses of each split.

5. The apparatus of claim 4 wherein the non-contiguous physical addresses of each split map to a plurality of dies.

6. The apparatus of claim 1 wherein the monitoring instructions process pending defect data logs from the SSDs to identify splits with which reported defects are associated.

7. The apparatus of claim 6 wherein the rebuilding instructions select the spare split from an SSD having a greatest number of spare splits.

8. The apparatus of claim 1 comprising remediation instructions that attempt to repair the failed split.

9. The apparatus of claim 8 wherein the remediation instructions return repaired splits to service as spare splits and mark unrepairable splits as lost splits.

10. The apparatus of claim 1 wherein the rebuilding instructions rebuild all failed data splits of a failed SSD on a spare SSD, and the remediation instructions return repaired SSDs to service and mark unrepairable SSDs as lost.

11. A method comprising:
    in a storage array comprising at least one computing node comprising at least one processor and non-transitory memory, and a drive array comprising a plurality of SSDs (solid state drives), the drive array in communication with the computing node:
       externally with respect to the SSDs, organizing the SSDs as a plurality of splits, each split comprising a contiguous range of logical addresses presented by one of the SSDs and having a capacity equal to other splits of the plurality of splits;
       grouping a plurality of spare splits of the plurality of splits into a redundancy group;
       detecting a failed split of the redundancy group on a non-failed one of the SSDs; and
       rebuilding the failed split on a spare split.

12. The method of claim 11 comprising organizing the splits into logical slices of equal capacity corresponding to a track, a cylinder, a fraction of SSD capacity, or a percentage of SSD capacity.

13. The method of claim 11 wherein the logical addresses are LBAs (logical block addresses), and non-contiguous physical addresses map to the contiguous range of logical addresses of each split, and the non-contiguous physical addresses of each split map to a plurality of dies, and comprising organizing each split as a contiguous range of LBAs.

14. The method of claim 11 comprising processing pending defect data logs from the SSDs to identify splits with which reported defects are associated.

15. The method of claim 14 comprising selecting the spare split from an SSD having a greatest number of spare splits.

16. The method of claim 11 comprising attempting to repair the failed split.

17. The method of claim 16 comprising returning repaired splits to service as spare splits.

18. The method of claim 17 comprising marking unrepairable splits as lost splits.

19. The method of claim 11 comprising rebuilding all failed data splits of a failed SSD on a spare SSD.

20. The method of claim 19 comprising returning repaired SSDs to service and marking unrepairable SSDs as lost.

* * * * *